United States Patent
Ward et al.

(10) Patent No.: US 8,443,313 B2
(45) Date of Patent: May 14, 2013

(54) CIRCUIT DESIGN OPTIMIZATION

(75) Inventors: Samuel I. Ward, Austin, TX (US);
Kevin F. Reick, Round Rock, TX (US);
Bryan J. Robbins, Poughkeepsie, NY (US); Thomas E. Rosser, Austin, TX (US); Robert J. Shadowen, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 316 days.

(21) Appl. No.: 12/858,522

(22) Filed: Aug. 18, 2010

(65) Prior Publication Data

US 2012/0047476 A1 Feb. 23, 2012

(51) Int. Cl.
*G06F 17/50* (2006.01)
(52) U.S. Cl.
USPC ............ 716/104; 716/106; 716/132; 716/136
(58) Field of Classification Search .................... None
See application file for complete search history.

(56) References Cited

U.S. PATENT DOCUMENTS

| | | | |
|---|---|---|---|
| 6,996,792 | B2 | 2/2006 | Pie et al. |
| 7,188,284 | B2 * | 3/2007 | Mitra et al. ................ 714/726 |
| 7,249,330 | B2 | 7/2007 | Roesner et al. |
| 7,370,308 | B2 | 5/2008 | Pie et al. |
| 7,865,855 | B2 * | 1/2011 | Koehl et al. .................. 716/113 |
| 7,908,574 | B2 * | 3/2011 | Larouche et al. ............ 716/100 |
| 2009/0064069 | A1 | 3/2009 | Koehl et al. |

FOREIGN PATENT DOCUMENTS

CN 101187958 5/2008

OTHER PUBLICATIONS

Saxena, N.; Scalable Solutions to Specification and Verification of Large Designs, 1999, vol. 6012-B Dissertation Abstracts International, p. 6288.
Hentzchke, RF. et al.; Improving Run Times by Pruned Application of Synthesis Transforms, 2005, ACM, pp. 38-43.
Rao, RR. et al.; Soft Error Reduction in Combinational Logic Using Gate Resizing and Flipflop Selection, 2006, ACM, pp. 502-509.
Roy, JA. et al.; EPIC: Ending Piracy of Integrated Circuits, 2008, EDAA, pp. 1069-1074.

* cited by examiner

*Primary Examiner* — Leigh Garbowski
(74) *Attorney, Agent, or Firm* — Patrick E. Caldwell, Esq.; The Caldwell Firm, LLC

(57) ABSTRACT

A method comprises generating a first behavioral model of a circuit describing a physical circuit in a first configuration. The first configuration comprises a first master latch, a first fanout path, and a logic cone. The first master latch couples to the first fanout path and is configured to receive a first data input signal. The first fanout path comprises a plurality of output sinks, each coupled to the logic cone. The first behavioral model is modified to generate a second behavioral model describing the physical circuit in a second configuration. The second configuration comprises an error circuit and an abstract latch clone based on the first master latch. A configuration file is generated based on the second behavioral model. The configuration file comprises information representing a plurality of instantiated latch clones based on the abstract latch clone, each configured to couple to the first data input signal and to one or more output sinks of the plurality of output sinks. The second behavioral model and the configuration file are together configured for input to a synthesis tool.

24 Claims, 8 Drawing Sheets

CIRCUIT DESIGN OPTIMIZATION

TECHNICAL FIELD

The present invention relates generally to the field of automated electronic circuit design, and, more particularly, to circuit design optimization.

BACKGROUND

Modern electronic devices are often made up of large numbers of sub-components such as latches and gates, embodied in transistors, which frequently number in the millions. In some cases, the functional design of an electrical or electronic device includes electrical paths that pass through a single latch to a large number of other sub-components (sometimes referred to as "output sinks"). This is especially true for devices in early stages of the development cycle, before optimization and refinement of the design. The greater the number of output sinks loading a latch, called the "fanout," the higher the load on the latch and the higher the delay of the path from the latch through the output sinks.

Latch cloning, sometimes referred to as "latch replication", has long been an effective tool to improve overall delay for paths with large fanouts. Broadly, latch cloning reduces the total output load of the sinks collectively by dividing the load between the original latch and one or more clones of the original latch. In some cases, latch cloning includes improving the latch position to a more optimal location in the circuit layout. There are two particularly well known methods for cloning a latch.

First is the traditional "manual" method, wherein the design engineer performs a manual process to identify which latches are suitable for cloning. Having selected a latch to clone, the design engineer manually allocates the output sinks of the selected latch among the clones and the original latch. One skilled in the art will appreciate that this approach reduces the fanout for the original latch by dividing the electrical load among multiple latches. Lastly, the design engineer modifies the hardware description language (HDL) representation of the design to include the cloned latches and the new output sink allocations.

There are three major disadvantages to the manual method. First, it is often very difficult for the designer to split certain components, such as a bus, for example, into discrete collections of output sinks. The challenges associated with splitting such components tends to produce resultant HDL representations that are very difficult to read, which makes the HDL representation difficult to understand and optimize.

Second, because the designer typically works with behavioral representations of the design, the designer rarely knows the specific layout positions of the latches or their output sinks. Thus, while the designer may produce a design that is optimal from a logic perspective, the designer cannot compare the physical performance of competing designs. As such, the designer may not be able to produce an optimal allocation of output sinks among the latch and its clones.

Third, the HDL representation of the entire design tends to change frequently, especially in the earlier stages of development. As such, even if the designer does overcome the first two challenges, the effort may be wasted when a design revision changes the HDL representation such that what was once an optimal overall solution is no longer optimal. In the manual method, the designer must manually update the HDL representation each time there is a change to that logic cone (that is, the downstream logic to which the output sinks connect) to achieve the best allocation. For these reasons, design engineers developed the second method for latch cloning.

The second traditional method for latch cloning involves serial loading the scan chains. Broadly, serially loading the scan chains occurs when the inbound scan chain loading signal on one latch is different from the inbound scan chain loading signal on a different latch of the same logic cone. The second traditional method overcomes some of the manual method's disadvantages in that synthesis tools can now optimally allocate the latch sinks during each synthesis run. Further, the second traditional method does not require the designer to split the output sinks manually.

But the second traditional method also suffers from drawbacks. For example, the second traditional method offers only limited visibility to the test team during debug and bring-up. The issue arises in that the test cases for each logic cone are different and therefore the inbound scan chain signals are different. This causes significant difficulty during fault diagnostics, which can cause challenges that outweigh the benefits of the second traditional method.

Other approaches have also been attempted, but also suffer from drawbacks. For example, for many circuit optimization techniques, there are tools configured to provide automatic implementation of the technique. But typical attempts to automate latch cloning have caused the standard verification tools and design-for-test (DFT) tools to fail.

BRIEF SUMMARY

The following summary is provided to facilitate an understanding of some of the innovative features unique to the embodiments disclosed and is not intended to be a full description. A full appreciation of the various aspects of the embodiments can be gained by taking into consideration the entire specification, claims, drawings, and abstract as a whole.

A method comprises generating a first behavioral model of a circuit describing a physical circuit in a first configuration. The first configuration comprises a first master latch, a first fanout path, and a logic cone. The first master latch couples to the first fanout path and is configured to receive a first data input signal. The first fanout path comprises a plurality of output sinks, each coupled to the logic cone. The first behavioral model is modified to generate a second behavioral model describing the physical circuit in a second configuration. The second configuration comprises an error circuit and an abstract latch clone based on the first master latch. A configuration file is generated based on the second behavioral model. The configuration file comprises information representing a plurality of instantiated latch clones based on the abstract latch clone, each configured to couple to the first data input signal and to one or more output sinks of the plurality of output sinks. The second behavioral model and the configuration file are together configured for input to a synthesis tool.

A computer program product for circuit design comprises a computer readable storage medium having computer readable program code embodied therewith. The computer readable program code comprises computer readable program code configured to generate a first behavioral model of a circuit describing a physical circuit in a first configuration. The first configuration comprises a first master latch, a first fanout path, and a logic cone. The first master latch couples to the first fanout path and is configured to receive a first data input signal. The first fanout path comprises a plurality of output sinks, each coupled to the logic cone. The computer readable program code is configured to modify the first behavioral model to generate a second behavioral model describing the physical circuit in a second configuration. The second configuration comprises an error circuit and an abstract latch clone, the abstract latch clone being based on the first master latch. The computer readable program code is configured to generate a configuration file based on the second behavioral model. The configuration file comprises information representing a plurality of instantiated latch clones based on the abstract latch clone. The instantiated latch clones are each configured to couple to the first data input signal and to one or more output sinks of the plurality of output sinks. The computer readable program code is configured to configure the second behavioral model and the configuration file for input to a synthesis tool.

A system comprises a user interface configured to receive user input from a user. A generation module is configured to generate a first behavioral model of a circuit, based on received user input, the first behavioral model describing a physical circuit in a first configuration. The first configuration comprises a first master latch, a first fanout path, and a logic cone. The first master latch coupled to the first fanout path and is configured to receive a first data input signal. The first fanout path comprises a plurality of output sinks, each coupled to the logic cone. A module editor is configured to modify the first behavioral model to generate a second behavioral model describing the physical circuit in a second configuration. The second configuration comprises an error circuit and an abstract latch clone, the abstract latch clone being based on the first master latch. The module editor is further configured to generate a configuration file based on the second behavioral model. The configuration file comprises information representing a plurality of instantiated latch clones based on the abstract latch clone. The instantiated latch clones are each configured to couple to the first data input signal and to one or more output sinks of the plurality of output sinks. The second behavioral model and the configuration file are together configured for input to a synthesis module.

BRIEF DESCRIPTION OF THE SEVERAL VIEWS OF THE DRAWINGS

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

DETAILED DESCRIPTION

Figure 1A:
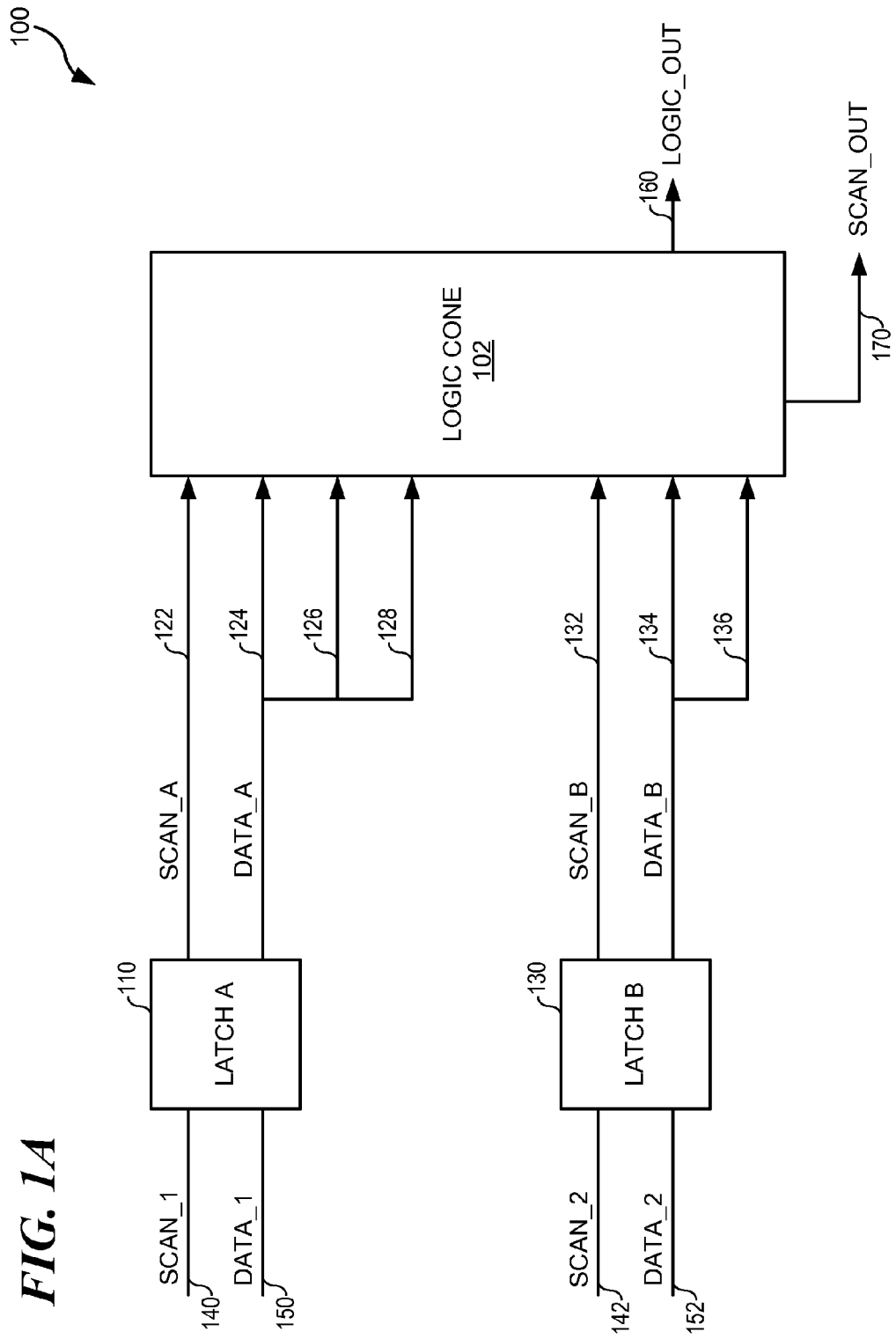
FIG. 1A illustrates a high-level circuit diagram showing an electronic circuit in accordance with one embodiment.

The particular values and configurations discussed in these non-limiting examples can be varied and are cited merely to illustrate at least one embodiment and are not intended to limit the scope of the invention.

In the following discussion, numerous specific details are set forth to provide a thorough understanding of the present invention. Those skilled in the art will appreciate that the present invention may be practiced without such specific details. In other instances, well-known elements have been illustrated in schematic or block diagram form in order not to obscure the present invention in unnecessary detail. Additionally, for the most part, details concerning network communications, electro-magnetic signaling techniques, user interface or input/output techniques, and the like, have been omitted inasmuch as such details are not considered necessary to obtain a complete understanding of the present invention, and are considered to be within the understanding of persons of ordinary skill in the relevant art.

As will be appreciated by one skilled in the art, the present invention may be embodied as a system, method, or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module," or "system." Furthermore, the present invention may take the form of a computer program product embodied in one or more computer readable medium (s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions.

These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Referring now to the drawings, FIG. 1 is a high-level circuit diagram illustrating an exemplary circuit 100, in a particular stage in the design process, in accordance with a preferred embodiment of the present invention. In one embodiment, circuit 100 is embodied as part of a larger integrated circuit (IC) chip.

Generally, as used herein, a "chip" is a physical object. This is the physical object that is the result of the fabrication process. Broadly, the ultimate goal of circuit design is to produce a chip that operates according to the desired performance specifications.

As used herein, a "layout" is an abstracted representation of the physical properties of a chip, especially the location, measurements, and connections between physical features of the chip. Broadly, a "layout" indicates the relative placement and features of devices on the chip, including connectors running between devices. The layout is frequently in the form of a "printed circuit board" (PCB) layout. Generally, fabrication systems use the layout, or a derivative thereof, such as a lithography photomask pattern, to manufacture the chip.

Layouts can sometimes be difficult to modify for optimal performance, especially early in the design process. Instead, design engineers use more abstract representations of the chip to work up early designs. There are a number of tools designed to manipulate and test these abstract representations to ensure that a design works as expected (a process sometimes called "verification") and to identify performance characteristics of the design.

There are two general forms of these abstract representations: structural representations and behavioral representations. As used herein, a "structural representation" or "structural model" is an abstracted representation of the various devices and structures of a chip, such as logic gates, connectors, and transistors, for example. Where a layout typically includes precise relative positioning between connected devices, a structural representation typically indicates only that the devices are connected and not, for example, where those devices are located on a PCB. In some cases, a structural representation may include some information about the connection between devices, such as wire length and width/depth, to facilitate electrical testing of the design. Generally, as used herein, "analysis" of a structural representation produces a behavioral representation.

As used herein, a "behavioral representation" or "behavioral model" is an abstracted representation of the various functions embodied on the chip, such as processors, adders, memory arrays, and AND/OR gates, for example. Where the structural representation typically describes the devices on the chip, the behavioral representation describes the functions those devices perform. As such, the behavioral representation can be implemented in a number of different structural representations, each of which has attendant benefits and drawbacks. The art of circuit design includes implementing the desired behavior in a layout that best achieves the performance objectives of the chip, particularly in terms of power consumption, cost-effectiveness, and time-to-market.

Generally, as used herein, "synthesis" of a behavioral representation produces a structural representation. Broadly, the design engineer manipulates both structural and behavioral representations over the course of design development, verification, and testing. The boundary between a purely structural model and a purely behavioral model is sometimes unclear. For example, a design engineer may wish to impose restraints on the structures implemented to embody a particular behavioral feature. As such, a typical behavioral model often includes certain specified structures or structural features. During synthesis, the synthesis module employs specified structures where defined and uses either library modules or ad hoc implementations where the structures are not specified. The resultant structural model is therefore a combination of user-defined structures and structures selected though the automated optimization processes of the synthesis tool.

One skilled in the art will understand that there is a tradeoff in automation efficiency between specifying structures in a behavioral model and taking advantage of the optimization opportunities that abstraction to a behavioral model provides. Generally, however, a Verilog or VHDL representation of a design, for example, is a behavioral model. Similarly, a Cadence or PDSRTL representation, for example, is a structural model. The embodiments disclosed herein offer significant advantages that improve the design process in a number of ways, as described in more detail below.

The various embodiments are described herein with respect to the design development of exemplary circuit 100. One skilled in the art will appreciate that the various embodiments can be configured to improve the design process of any kind of circuit, electronic device, or chip. In the illustrated embodiment, circuit 100 includes a logic cone 102 coupled to a pair of latches, latch A 110 and latch B 130. Logic cone 102 is an otherwise convention logic cone, modified as described herein. That is, in one embodiment, logic cone 102 includes downstream logic that receives data and scan input from latch A 110 and latch B 130. One skilled in the art will recognize this configuration as a common configuration frequently used in IC design.

In the illustrated embodiment, latch A 110 is an otherwise conventional latch, modified as described herein, and configured to receive a SCAN_1 signal 140 and a DATA_1 signal 150. Latch A generates two output signals, SCAN_A 122 and a DATA_A signal that, in the illustrated embodiment, is distributed along a fanout that includes three output sinks 124, 126, and 128. Generally, an "output sink" is a load on a latch and, in the illustrated embodiment, serves as an input signal to logic cone 102.

Similarly, in the illustrated embodiment, latch B 130 is an otherwise conventional latch, modified as described herein, and configured to receive a SCAN_2 signal 142 and a DATA_2 signal 152. In one embodiment, SCAN_2 signal 142 is identical to SCAN_1 signal 140. Latch B generates two output signals, SCAN_B 132 and a DATA_B signal that, in the illustrated embodiment, is distributed along a fanout that includes two output sinks 134 and 136.

As shown in the illustrated embodiment, logic cone 102 receives the above described signals from latch A 110 and latch B 130. Based on the received signals, logic cone 102 generates a LOGIC_OUT signal 160 and a SCAN_OUT signal 170. One skilled in the art will understand that logic cone 102 generates the LOGIC_OUT signal 160 in response to the input data signals DATA_A and DATA_B. Similarly, logic cone 102 generates SCAN_OUT signal 170 in response to the input scan signals SCAN_A 122 and SCAN_B 132.

Generally, in FIG. 1A, circuit 100 is shown as a circuit diagram, in a stable preparatory state in advance of the circuit design improvements of the embodiments disclosed herein. As described above, design engineers typically manipulate circuit designs in model form.

Figure 1B:
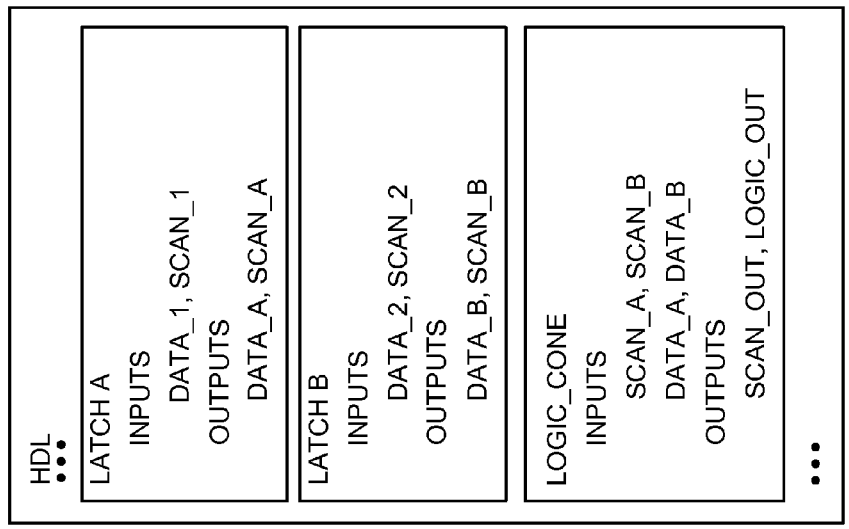
FIG. 1B illustrates a segment of a behavioral model in accordance with one embodiment.

FIG. 1B illustrates a portion 101 of an exemplary behavioral model describing circuit 100. As shown, portion 101 includes hardware description language (HDL) representations of latch A 110, latch B 130, and logic cone 102. In one embodiment, the HDL is Verilog. In an alternate embodiment, the HDL is Very High-Speed Integrated Circuit (VHSIC) HDL (VHDL).

As described in more detail below, the embodiments disclosed herein modify circuit 100 to improve performance. One skilled in the art will understand that performance improvements are often measured with respect to several abstraction levels, including the IC chip as a whole. As such, as used herein, to "improve performance" means to manipulate the configuration of a circuit design, whether in behavioral model, structural model, layout, or other format, in furtherance of improving a performance metric.

Figure 2A:
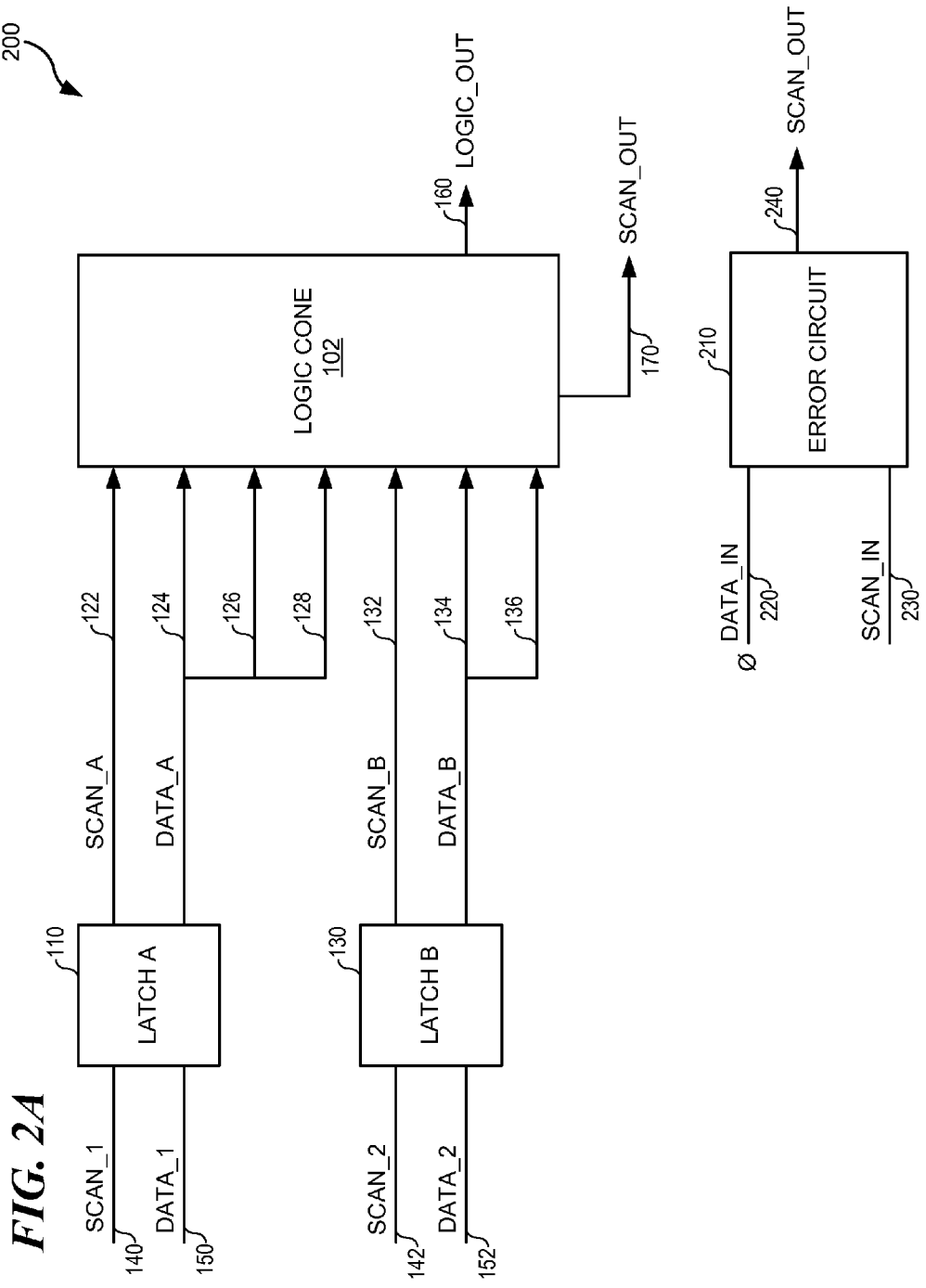
FIG. 2A illustrates a high-level circuit diagram showing an electronic circuit in accordance with one embodiment.

FIG. 2A illustrates one such modification to improve performance. Specifically, FIG. 2A is a high-level circuit diagram illustrating a circuit 200. In the illustrated embodiment, circuit 200 is a modification of circuit 100 of FIG. 1. As shown in the illustrated embodiment, circuit 200 includes an error circuit 210.

In one embodiment, error circuit 210 is a latch. Generally, as described in more detail below, error circuit 210 is configured to receive scan and other data and to generate an output scan signal useful in fault testing. In the final form, after additional modifications described in more detail below, error circuit 210 will couple to various components of circuit 200.

In the illustrated embodiment, however, error circuit 210 receives input from two sources, each coupled to temporary input sources. Specifically, in the illustrated embodiment, error circuit 210 input DATA_IN 220 is coupled to logic zero. As described in more detail below, the illustrated temporary configuration provides certain advantages during intermediate testing. In the illustrated embodiment, error circuit 210 also includes input SCAN_IN 230 and output SCAN_OUT 240.

Figure 2B:
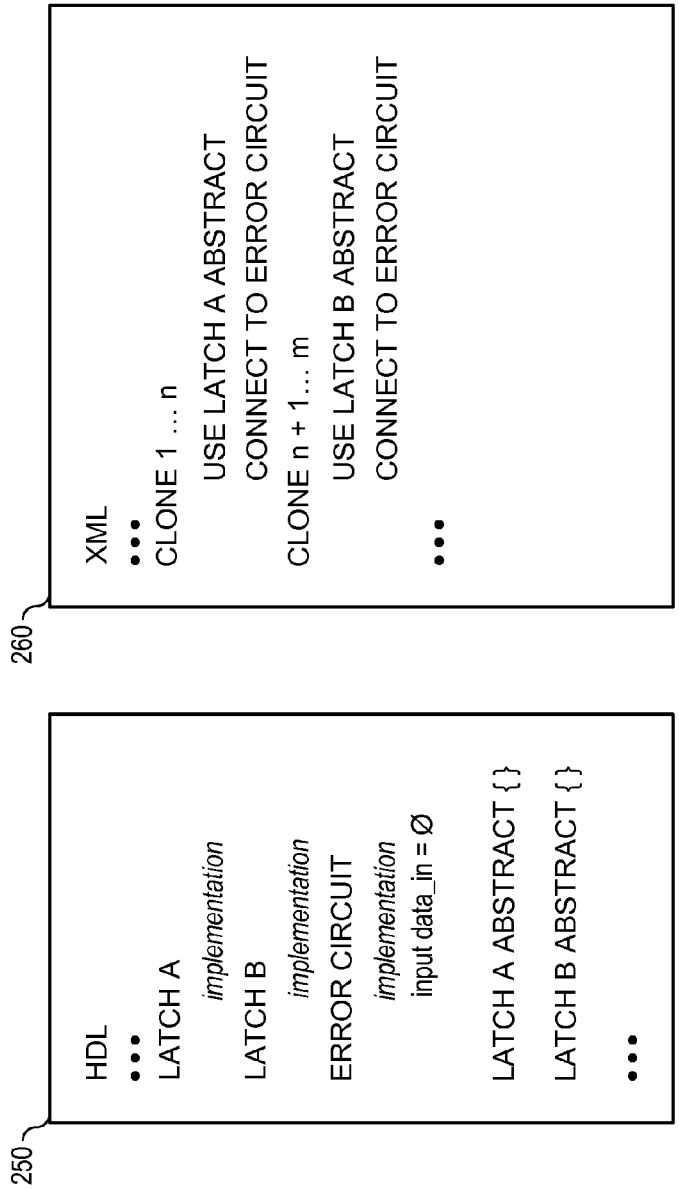
FIG. 2B illustrates a segment of a behavioral model and a segment of a configuration file in accordance with one embodiment.

FIG. 2B illustrates a portion 201 of an exemplary behavioral model 250 and an exemplary configuration file 260 describing circuit 200. As shown, model 250 includes hardware description language (HDL) representations of latch A 110, latch B 130, and error circuit 210. In one embodiment, the HDL is Verilog. In an alternate embodiment, the HDL is VHDL.

In the illustrated embodiment, model 250 includes abstract representations of latch A 110 and latch B 130. As described in more detail below, the design system uses the abstract representations to instantiate specific latch clones. One skilled in the art will understand that these abstract representations are not instantiated in model 250 and, therefore, will be ignored by most traditional test and verification tools. One skilled in the art will also observe that the circuit 200 illustrated in FIG. 2A, as represented in model 250, does not include latch clones.

Instead, latch clone information is represented in a separate configuration file, configuration file 260. As shown, configuration file 260 includes representations providing additional information about circuit 200. In one embodiment, the configuration file representations are formatted in eXtended Markup Language (XML).

In the illustrated embodiment, configuration file 260 includes representations identifying certain clone latches. In particular, in the illustrated embodiment, file 260 indicates that circuit 200 includes n clones of latch A 110, configured to couple to error circuit 210. Similarly, in the illustrated embodiment, file 260 indicates that circuit 200 includes m-n clones of latch B 130, also configured to couple to error circuit 210. Thus, generally, configuration file 260 indicates which master latches to clone, the number of clones to instantiate, and the error latch to which the cloned latches couple.

Together, behavioral model 250 and configuration file 260 represent modifications to circuit 200 to advance circuit 200 to a specific intermediate state in the design process. As described in more detail below, with circuit 200 represented in behavioral model 250 and configuration file 260, the design engineer can run certain testing and verification tools on behavior model 250 that overcome disadvantages of previous approaches, without sacrificing the ability to automate, at least in part, latch cloning optimizations.

Generally, the design engineer can perform various optimization techniques using behavioral model 250 and configuration file 260 in advance of synthesis. When the design engineer is ready to synthesize a structural model, behavioral model 250 and configuration file 260, as modified by the design process, can be configured for submission to a synthesis tool. As described in more detail below, the synthesis tool is configured to generate a structural model that implements the remaining steps in the latch cloning process.

Figure 3:
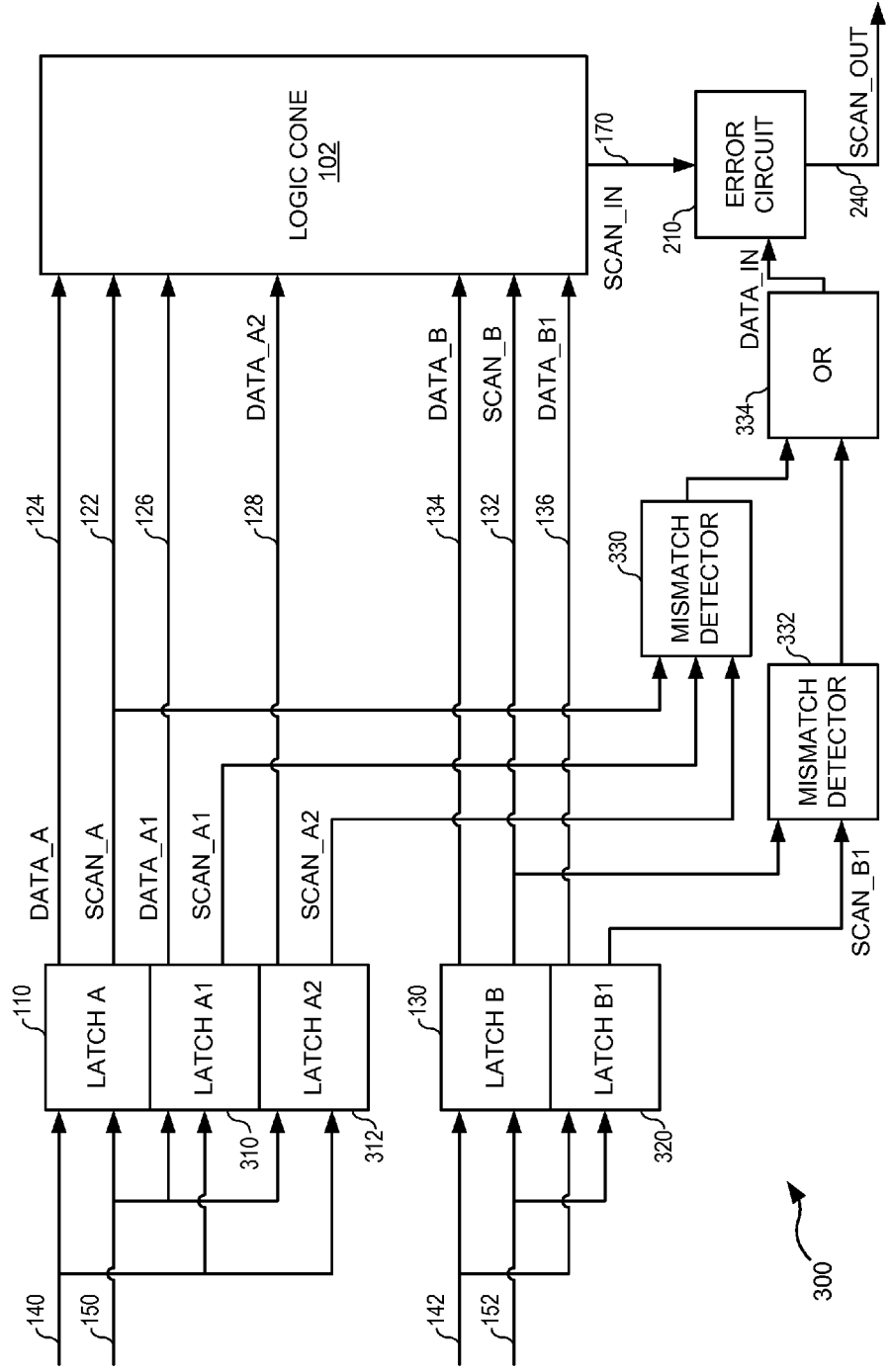
FIG. 3 illustrates a high-level circuit diagram showing an electronic circuit in accordance with one embodiment.

Specifically, FIG. 3 illustrates a high-level circuit diagram depicting a circuit 300 as synthesized from behavioral model 250 and configuration file 260. In the illustrated embodiment, circuit 300 includes a number of latch clones and additional logic gates coupled to logic cone 102 and error circuit 210. As described in more detail below, in one embodiment, the synthesis tool is configured to add and connect these additional structures.

Specifically, circuit 300 includes clone latch A1 310 and clone latch A2 312. Generally, clone latches 310 and 312 are clones of master latch A 110. As described above, in one embodiment, the synthesis tools instantiate clone latches 310 and 312 from an abstraction of master latch A 110, from behavioral model 250, according to configuration file 260. Clone latches 310 and 312 are configured to receive the same DATA_1 and SCAN_1 signals delivered to master latch A 110.

As shown, master latch A 110 delivers the SCAN_A signal to logic cone 102 and a structure of a scan error collector circuit, mismatch detector 330. In the illustrated embodiment, the scan error collector circuit includes mismatch detector 330, mismatch detector 332, and OR gate 334. In one embodiment, mismatch detector 330 and/or mismatch detector 332 are otherwise conventional exclusive OR (XOR) logic gates, modified as described herein. In the illustrated embodiment, OR gate 334 is an otherwise conventional OR gate, modified as described herein. As shown, the output of mismatch detectors 330 and 332 are the two inputs to OR gate 334. Further, the output of OR gate 334 feeds the DATA_IN input for error circuit 210.

In the illustrated embodiment, output sinks 126 and 128, which couple to master latch A 110 in circuit 100 of FIG. 1, are coupled to the clone latches in circuit 300. Specifically, in the illustrated embodiment, the synthesis tool has allocated the clone latch output signal DATA_A1, from clone latch 310, to output sink 126. Similarly, in the illustrated embodiment, the synthesis tool has allocated the clone latch output signal DATA_A2, from clone latch 312, to output sink 128. Thus, one skilled in the art will understand that the fanout from latch A 110 of circuit 300 is smaller as compared to the fanout of latch A 110 of circuit 100.

In the illustrated embodiment, the synthesis tool has also allocated the scan outputs of the clone latches. Specifically, the clone latch scan outputs do not feed into logic cone 102. Instead, the clone latch scan outputs feed into the scan error collector circuit. In the illustrated embodiment, the scan output of clone latch 310, SCAN_A1, feeds into mismatch detector 330. Similarly, the scan output of clone latch 312, SCAN_A2, feeds into mismatch detector 330. As such, any variation between the scan outputs of the master latch and its clones will cause a logic high output from mismatch detector 330. As the output of mismatch detector 330 is input into OR gate 334, a logic high output from mismatch detector 330 causes a logic high output from OR gate 334. As shown, OR gate 334 feeds the DATA_IN input of error circuit 210. In the illustrated embodiment, error circuit 210 is configured to indicate an error in response to a logic high input from OR gate 334. So configured, error latch 210 indicates mismatches between the scan outputs of the master latch A 110 and its clones.

Circuit 300 also includes clone latch B1 320. Generally, clone latch 320 is a clone of master latch B 130. As described above, in one embodiment, the synthesis tools instantiate clone latch 320 from an abstraction of master latch B 130, from behavioral model 250, according to configuration file 260. Clone latch 320 is configured to receive the same DATA_2 and SCAN_2 signals delivered to master latch B 130.

As shown, master latch B 130 delivers the SCAN_B signal to logic cone 102 and a structure of a scan error collector circuit, mismatch detector 332. In the illustrated embodiment, output sink 136, which couples to master latch B 130 in circuit 100 of FIG. 1, instead couples to a clone latch in circuit 300. Specifically, in the illustrated embodiment, the synthesis tool has allocated the clone latch output signal DATA_B1, from clone latch 320, to output sink 136. Thus, one skilled in the art will understand that the fanout from latch B 130 of circuit 300 is smaller as compared to the fanout of latch B 130 of circuit 100.

In the illustrated embodiment, the synthesis tool has also allocated the scan output of the clone latch of master latch B 130. Specifically, in the illustrated embodiment, the scan output of clone latch 320, SCAN_B1, feeds into mismatch detector 332. As such, any variation between the scan outputs of master latch B 130 and its clone will cause a logic high output from mismatch detector 332. As with mismatch detector 330, a logic high output propagates through the scan error collection circuit, eventually resulting in error circuit 210 indicating an error condition, as described above.

Figure 4:
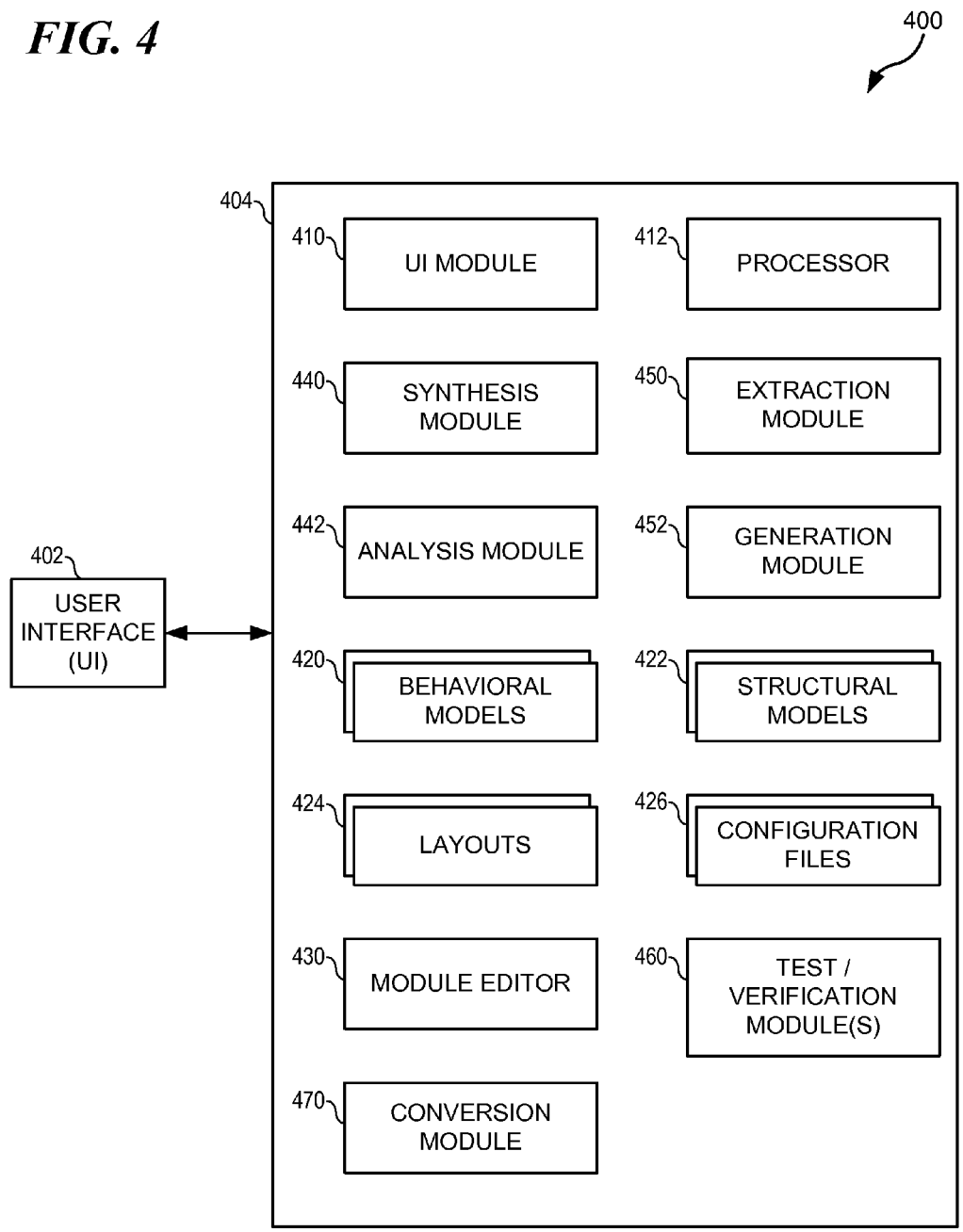
FIG. 4 illustrates a block diagram of a circuit design system in accordance with one embodiment.

Accordingly, circuit 300 illustrates an improvement over circuit 100. As described in more detail below, in one embodiment, the synthesis tool is configured to instantiate the cloned latches, allocate the output sinks among the master latches and the associated cloned latches, instantiate the scan error collection circuit, and connect the instantiated structures to the logic cone and the error circuit. As described above, the behavioral model 250, which does not include instantiated representations of the cloned latches, can be used in standard test and verification tools. Furthermore, the synthesis tool can be configured to use both the behavioral model 250 and configuration file 260 to automate some of the tedious work that caused difficulty in traditional approaches, especially the manual approach. FIG. 4 and the related description provide additional details regarding a system configured to implement the embodiments disclosed herein, as well as additional detail of the disclosed embodiments themselves.

FIG. 4 illustrates a high-level block diagram of a system 400, in accordance with one embodiment. Specifically, system 400 includes a user interface 402 coupled to a design system 404. User interface 402 is an otherwise conventional user interface (UI). For example, UI 402 can be configured as a workstation, a graphical UI (GUI), a command line interface, or other suitable interface. In one embodiment, design system 404 is a collection of components together configured to perform circuit design optimization as described herein. In one embodiment, design system 404 is a computer system configured as described herein.

In the illustrated embodiment, design system 404 includes UI module 410. Generally, UI module 410 is configured to interact with UI 402 and, in one embodiment, serves as a bridge between UI 402 and design system 404. In the illustrated embodiment, design system 404 also includes a processor 412. Generally, processor 412 is an otherwise conventional processor.

In the illustrated embodiment, design system 404 includes a plurality of behavioral models 420. Generally, behavioral models 420 are behavioral representations or models, as described above. In the illustrated embodiment, design system 404 includes a plurality of structural models 422. Generally, structural models 422 are structural representations or models, as described above.

In the illustrated embodiment, design system 404 includes a plurality of layouts 424. Generally, layouts 424 are layouts as described above. In the illustrated embodiment, design system 404 includes a plurality of configuration files 426. Generally, configuration files 426 are configuration files as described above.

In the illustrated embodiment, design system 404 includes module editor 430. Generally, module editor 430 is configured to receive user input and to manipulate and/or modify models and configuration files based on user input. For example, in one embodiment, module editor 430 is configured to manipulate and modify behavioral models 420, structural models 422, and configuration files 426. Broadly, in one embodiment, module editor 430 serves as a mechanism by which the design engineer can make manual changes to the behavioral and structural models and the configuration files, as described above.

In the illustrated embodiment, design system 404 also includes synthesis module 440 and analysis module 442. In one embodiment, synthesis module 440 is an otherwise conventional synthesis tool, tools, or suite of tools, modified as described herein. As described above, in one embodiment, synthesis module 440 is configured to generate a structural model 422 based on an input behavioral model 420 and, in one embodiment, a configuration file 426. Similarly, in one embodiment, analysis module 442 is an otherwise conventional "analysis" tool, tools, or suite of tools, modified as described herein. As described above, in one embodiment, analysis module 442 is configured to generate a behavioral model 422 based on an input structural model 422 and, in one embodiment, a configuration file 426.

Similarly, in the illustrated embodiment, design system 404 also includes extraction module 450 and generation module 452. In one embodiment, extraction module 450 is an otherwise convention extraction tool, tools, or suite of tools, modified as described herein. As described above, in one embodiment, extraction module 450 is configured to generate a structural module 422 based on an input layout 424 and, in one embodiment, a configuration file 426. Similarly, in one embodiment, generation module 452 is an otherwise conventional layout generation tool, tools, or suite of tools, modified as described herein. As described above, in one embodiment, generation module 452 is configured to generate a layout 424 based on an input structural model 422 and, in one embodiment, a configuration file 426.

In the illustrated embodiment, design system 404 includes a test/verification module(s) 460. Generally, module 460 is configured to provide one or more test and/or verification processes for one or more behavioral or structural models and/or layouts. One skilled in the art will understand that there many useful test and verification tools applicable to circuit design in every stage of development.

In the illustrated embodiment, design system 404 includes a conversion module 470. Generally, in one embodiment, conversion module 470 is configured to convert a layout 424 into a format usable by a fabrication system to manufacture a physical chip based on the design represented by layout 424. One skilled in the art will understand that there are many steps to manufacture a chip based on an underlying layout 424. For example, in one embodiment, conversion module 470 is configured to generate one or more lithography photomasks based on layout 424.

Thus, system 400 can be configured to implement the disclosed embodiments as described herein. More particularly, system 400 can be configured to implement the processes as described below with respect to FIGS. 5 and 6.

Figure 5:
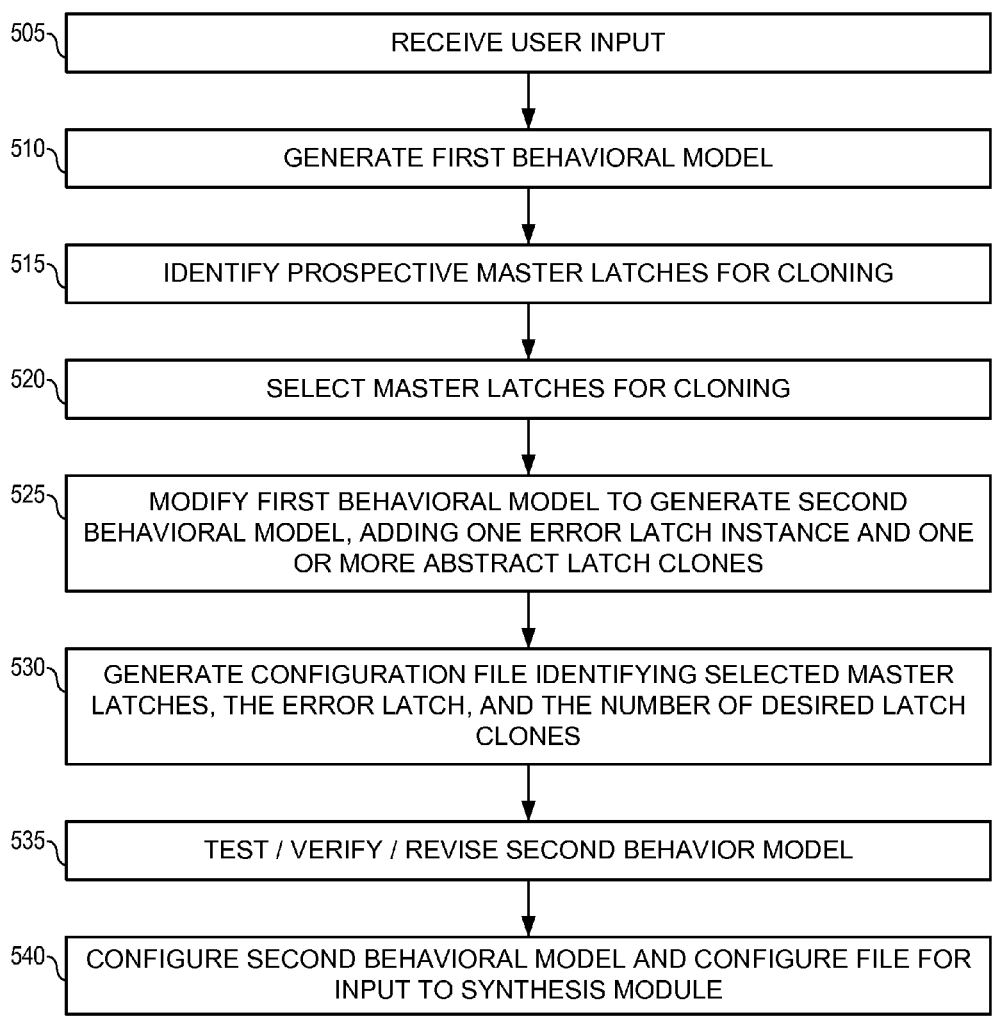
FIG. 5 illustrates a high-level flow diagram depicting logical operational steps of a circuit design method, which can be implemented in accordance with one embodiment.

FIG. 5 illustrates one embodiment of a method for circuit design optimization. Specifically, FIG. 5 illustrates a high-level flow chart 500 that depicts logical operational steps performed by, for example, system 400 of FIG. 4, which may be implemented in accordance with a preferred embodiment. Generally, design system 404 performs the steps of the method, unless indicated otherwise.

As indicated at block 505, the process begins, wherein design system 404 receives user input from a user. Generally, design system 404 receives an irregular stream of user input, including modifications to one or more files or models, instructions to save a design state, and other common instructions. One skilled in the art will understand that even automated design techniques require a substantial amount of user input and guidance.

Next, as indicated at block 510, system 404 generates a first behavioral model based on user input. In one embodiment, user input includes text input providing HDL code. In another embodiment, user input includes input produced by a design tool in response to user input.

Next, as indicated at block 515, system 404 identifies prospective master latches for cloning. As described above, in one embodiment, system 404 identifies prospective master latches based on an engineering analysis of the model under examination. In an alternate embodiment, system 404 identifies prospective master latches based on user input.

Next, as indicated at block 520, system 404 selects one or more master latches for cloning. In one embodiment, system 404 selects one or more master latches for cloning based on pre-determined parameters to select from prospective latches identified as suitable for cloning. In an alternate embodiment, system 404 selects one or more master latches based on user input, which, in one embodiment, system 404 receives in response to a presentation to the user of the master latches identifies as suitable for cloning.

Next, as indicated at block 525, system 404 modifies the first behavioral model to generate a second behavioral model. As described above, in one embodiment, system 404 adds an error latch instance to each clock domain for which system 404 expects to clone latches. As described above, in one embodiment, system 404 does not connect the added error latches to their associated logic cones. Also as described above, in one embodiment, system 404 adds an abstract latch descriptor to the first behavioral model for each master latch selected for cloning.

Next, as indicated at block 530, system 404 generates a configuration file providing additional information regarding the latch clones. For example, as described above, the latch clones are not specified or instantiated in the behavioral model of the design. Thus, in one embodiment, the latch clones are absent from the HDL representation of the design. Thus, in one embodiment, the configuration file contains model information identifying the master latch(es) selected for cloning, the error latches associated with the selected master latches (and their associated logic cones), and the number of desired latch clones for each selected master latch.

Next, as indicated at block 535, system 404 and the design engineer test, verify, and/or revise the second behavioral model. As described above, the disclosed embodiments can be configured such that the changes related to cloning are less likely to cause false positive failure test results. For example, because the latch clones are not instantiated and the error circuit is not connected to the logic cone in the HDL behavioral model, the design engineer can apply traditional test and verification tools to the behavioral model. When the design engineer settles on a behavioral model and configuration file for synthesis, the process continues.

Next, as indicated at block 540, the design engineer configures the second behavioral model and the configuration file for input to a synthesis module. In one embodiment, the tools the design engineer uses to modify the behavioral model and/or the configuration file are configured to save the models/files in a suitable configuration automatically. In another embodiment, the design engineer and/or system 404 configure the models/file as appropriate for the desired synthesis tool and the process ends.

Figure 6:
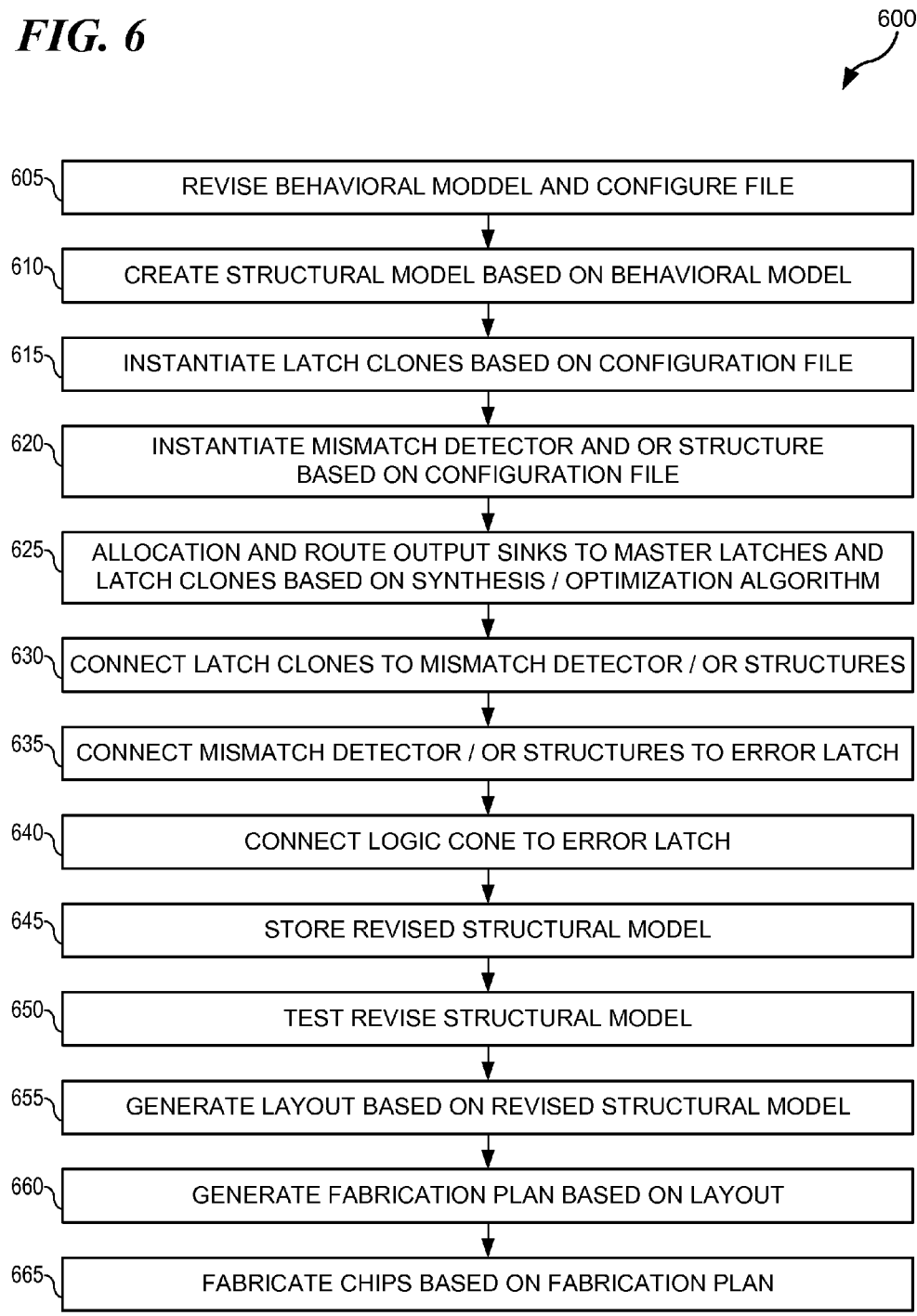
FIG. 6 illustrates a high-level flow diagram depicting logical operational steps of another circuit design method, which can be implemented in accordance with one embodiment.

FIG. 6 illustrates one embodiment of a method for circuit design optimization. Specifically, FIG. 6 illustrates a high-level flow chart 600 that depicts logical operational steps performed by, for example, system 400 of FIG. 4, which may be implemented in accordance with a preferred embodiment. Generally, design system 404 performs the steps of the method, unless indicated otherwise.

As indicated at block 605, the process begins, wherein the design engineer revises the behavioral model and/or configuration file. As described above, the behavioral models and configuration files, in some embodiments, are subject to numerous revisions in advance of synthesis and subsequent testing.

Next, as indicated at block 610, system 404 creates a structural model based on the behavioral model. Next, as indicated at block 615, system 404 instantiates latch clones in the structural model based on the configuration file. Next, as indicated at block 620, system 404 instantiates the scan error collection circuit, which, in the illustrated embodiment, is configured as mismatch detectors (and/or XOR gates) and OR gates, based on the configuration file.

Next, as indicated at block 625, system 404 allocates and routes the output sinks to the master latches and associated clones according to a synthesis and/or optimization algorithm. In one embodiment, the configuration file includes information selecting a particular algorithm. In an alternate embodiment, the synthesis tool itself is configured to optimize the output sink allocation.

Next, as indicated at block 630, system 404 connects the latch clones to the mismatch detector and OR structures of the scan error collection circuit. Next, as indicated at block 635, system 404 connects the mismatch detector and OR structures of the scan error collection circuit to the data input of the error latch. Next, as indicated at block 640, system 404 connects the logic cone scan output to the error latch scan input.

Next, as indicated at block 645, system 404 stores the revised structural model. Next, as indicated at block 650, system 404 and the design engineer test the revised structural model. As described above, there are a wide variety of tests available to a design engineer that are configured to test structural models of circuits. One skilled in the art will understand that the design process includes multiple iterations of testing/verification and design revision. As described above with respect to the behavioral model, the design engineer may choose to modify the structural model and/or the behavioral model multiple times over the course of the design process. When the design engineer settles on a structural model for generation, the process continues.

Next, as indicated at block 655, system 404 generates a layout based on the revised structural model. Next, as indicated at block 660, system 404 generates a fabrication plan based on the layout. Next, as indicated at block 665, system 404 (or a fabrication system) fabricates one or more chips based on the fabrication plan, and the process ends.

Accordingly, the disclosed embodiments provide numerous advantages over other methods and systems. For example, some embodiments provide a significant improvement over traditional methods in that the disclosed embodiments allow a design engineer to clone a latch point using automated tools that allow for subsequent timing improvements without having to edit the HDL representation manually. As described above, in traditional methods, typical cloning (of latches or other components) requires difficult HDL updates to implement. The disclosed embodiments allow designers to clone a latch without tedious manual editing of the HDL representation to add the latch clones to the HDL model.

For example, in traditional approaches, the design engineer would have to break up the HDL statements of a 64 bit logic cone in order to properly attribute a single bit to be cloned. As described above, the disclosed embodiments do not require the design engineer to manually edit the HDL model, except to add one error latch for each clock domain in which there will be clone latches. Furthermore, because the disclosed embodiments do not require the design engineer to continue to update the HDL model directly, the design process is simplified for the design engineer and others involved in the design process.

The disclosed embodiments also allow for synthesis-enabled latch cloning while avoiding the design-for-test obstacles associated with traditional solutions. For example, the disclosed embodiments do not suffer from the disadvantages associated with traditional methods that require that the designer to manually distribute the output sinks between the master latch and the cloned latches. Instead, the disclosed embodiments can be configured to use synthesis tools to assign the optimal output sink distribution automatically. As such, in one embodiment, every time the synthesis tools run, the tools optimize the output sinks automatically. Accordingly, the disclosed embodiments also improve the design process in that modifying timing by redistributing specific output sinks, changing the number of latch clones, and/or changing the placement of the latch clones does not require HDL model changes that invalidate the simulation and other test and/or verification results.

Moreover, the disclosed embodiments offer advantages that do not detract from the design objectives. For example, some embodiments implement a parallel data load parallel scan load design approach, while still maintaining 100% fault coverage. Additionally, the disclosed embodiments include latch clones that are transparent to typical simulation tools. As such, the simulation tools will not see the latch clones during simulation, and thus, the disclosed embodiments do not adversely impact typical simulation and/or verification tools. For example, design-for-test checking (DFT) is unlikely to be negatively affected because the synthesis tools can be configured to label the logic cone with the information necessary to detect false test cases.

Similarly, NEMO and other similar tools are unlikely to need updating because the instantiated latch clones are not represented in the HDL model, and, as such, these tools will not identify the latch clones as orphaned latches. Additionally, in some embodiments, other rule checking algorithms, such as clock domain and scan connection verification techniques, can be configured as part of the synthesis process, thereby delaying clone latch instantiation until necessary to verify and/or test the design. One skilled in the art will understand that the disclosed embodiments therefore offer significant advantages over traditional methods and systems.

Further, the disclosed embodiments offer additional technical advantages. For example, in some embodiments, as described above, the error circuit is instantiated in the HDL model with its data input tied to zero. As such, the design engineer can use design tools such as, for example, MR7, to update the error circuit, as is done for ordinary latches. Additionally, in some embodiments, with the input signal to the latch clone defined, the synthesis tools can be configured to make all the connections to that input signal. Moreover, some of the disclosed embodiments preserve the error circuit output data. As such, and because the error circuit input is, in some embodiments, tied to logic zero, the design engineer can use the error circuit output data if so desired. One skilled in the art will understand that the disclosed embodiments therefore offer significant additional advantages over traditional methods and systems.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

One skilled in the art will appreciate that variations of the above-disclosed and other features and functions, or alternatives thereof, may be desirably combined into many other different systems or applications. Additionally, various presently unforeseen or unanticipated alternatives, modifications, variations or improvements therein may be subsequently made by those skilled in the art, which are also intended to be encompassed by the following claims.

What is claimed is:

1. A computer-implemented method, comprising:
   generating a first behavioral model of a circuit, the first behavioral model describing a physical circuit in a first configuration;
      wherein the first configuration comprises a first master latch, a first fanout path, and a logic cone;
      the first master latch coupled to the first fanout path;
      the first master latch configured to receive a first data input signal;
      wherein the first fanout path comprises a plurality of output sinks, each of the plurality of output sinks coupled to the logic cone;
   modifying the first behavioral model to generate a second behavioral model, the second behavioral model describing the physical circuit in a second configuration;
      wherein the second configuration comprises an error circuit and an abstract latch clone;
      wherein the abstract latch clone is based on the first master latch; and
   generating a configuration file based on the second behavioral model;
      wherein the configuration file comprises information representing a plurality of instantiated latch clones based on the abstract latch clone;
      wherein the instantiated latch clones are each configured to couple to the first data input signal and to one or more output sinks of the plurality of output sinks; and
      wherein the second behavioral model and the configuration file are together configured for input to a synthesis tool.

2. The method of claim 1, further comprising:
   synthesizing a first structural model from the second behavioral model and the configuration file;
   wherein the first structural model describes the physical circuit in a third configuration;
   wherein the third configuration comprises a first instantiated clone latch, a second fanout path, and a third fanout path;
   wherein the second fanout path comprises a first subset of output sinks from the first fanout path, coupled from the first master latch to the logic cone;
   wherein the third fanout path comprises a second subset of output sinks from the first fanout path, coupled from the first instantiated clone latch to the logic cone; and
   wherein output sinks in the second fanout path are not coupled directly to the first instantiated cloned latch and output sinks in the second fanout path are not coupled directly to the first master latch.

3. The method of claim 2, further comprising:
   wherein the first master latch is further configured to receive a first scan input signal, and to generate a first data signal and a first scan signal;
   wherein the first master latch is further configured to propagate the first data signal and the first scan signal along the second fanout path;
   wherein the first instantiated cloned latch is further configured to receive the first scan input signal and to generate a second scan signal; and
   wherein the first instantiated cloned latch is further configured to propagate the second scan signal to the error circuit.

4. The method of claim 2, further comprising:
   wherein the first instantiated cloned latch is further configured to receive a first scan input signal and to generate a first scan output signal;
   wherein the first instantiated cloned latch is further configured to propagate the first scan output signal to a scan error collector circuit;
   the scan error collector circuit comprising an exclusive OR gate; and
   wherein the scan error collector circuit couples to the error circuit.

5. The method of claim 1, further comprising:
   wherein the first configuration comprises a second master latch; and
   selecting between the first master latch and the second master latch to select a master latch for cloning.

6. The method of claim 1, further comprising:
   wherein the first configuration comprises a second master latch; and
   wherein the second configuration further comprises a second abstract latch based on the second master latch.

7. The method of claim 1, further comprising:
   wherein the first configuration comprises a second master latch;
   wherein the second configuration further comprises a second abstract latch based on the second master latch;
   wherein the third configuration comprises a second instantiated clone latch, a fourth fanout path, and a fifth fanout path;
   wherein the fourth fanout path comprises a first plurality of output sinks, coupled from the second master latch to the logic cone;
   wherein the fifth fanout path comprises a second plurality of output sinks, coupled from the second instantiated clone latch to the logic cone;
   wherein output sinks in the second fanout path are not coupled directly to the first instantiated cloned latch and output sinks in the second fanout path are not coupled directly to the first master latch;
   wherein the first instantiated cloned latch is further configured to receive a first scan input signal and to generate a first scan output signal;
   wherein the first instantiated cloned latch is further configured to propagate the first scan output signal to a first exclusive OR gate of a scan error collector circuit;

wherein the second instantiated cloned latch is further configured to receive a second scan input signal and to generate a second scan output signal;

wherein the second instantiated cloned latch is further configured to propagate the second scan output signal to a second exclusive OR gate of the scan error collector circuit;

the scan error collector circuit comprising the first exclusive OR gate, the second exclusive OR gate, and a first OR gate; and wherein the first OR gate couples to the error circuit.

8. The method of claim 1, further comprising:

the error circuit comprising a data input; and wherein the data input couples to logic zero.

9. A computer program product for circuit design, the computer program product comprising:

a non-transitory computer readable storage medium having computer readable program code embodied therewith, the computer readable program code comprising:

computer readable program code configured to generate a first behavioral model of a circuit, the first behavioral model describing a physical circuit in a first configuration;

wherein the first configuration comprises a first master latch, a first fanout path, and a logic cone;

the first master latch coupled to the first fanout path;

the first master latch configured to receive a first data input signal;

wherein the first fanout path comprises a plurality of output sinks, each of the plurality of output sinks coupled to the logic cone;

computer readable program code configured to modify the first behavioral model to generate a second behavioral model, the second behavioral model describing the physical circuit in a second configuration;

wherein the second configuration comprises an error circuit and an abstract latch clone;

wherein the abstract latch clone is based on the first master latch; and computer readable program code configured to generate a configuration file based on the second behavioral model;

wherein the configuration file comprises information representing a plurality of instantiated latch clones based on the abstract latch clone;

wherein the instantiated latch clones are each configured to couple to the first data input signal and to one or more output sinks of the plurality of output sinks; and computer readable program code configured to configure the second behavioral model and the configuration file for input to a synthesis tool.

10. The computer program product of claim 9, further comprising:

computer readable program code configured to synthesize a first structural model from the second behavioral model and the configuration file;

wherein the first structural model describes the physical circuit in a third configuration;

wherein the third configuration comprises a first instantiated clone latch, a second fanout path, and a third fanout path;

wherein the second fanout path comprises a first subset of output sinks from the first fanout path, coupled from the first master latch to the logic cone;

wherein the third fanout path comprises a second subset of output sinks from the first fanout path, coupled from the first instantiated clone latch to the logic cone; and wherein output sinks in the second fanout path are not coupled directly to the first instantiated cloned latch and output sinks in the second fanout path are not coupled directly to the first master latch.

11. The computer program product of claim 10, further comprising:

wherein the first master latch is further configured to receive a first scan input signal, and to generate a first data signal and a first scan signal;

wherein the first master latch is further configured to propagate the first data signal and the first scan signal along the second fanout path;

wherein the first instantiated cloned latch is further configured to receive the first scan input signal and to generate a second scan signal; and wherein the first instantiated cloned latch is further configured to propagate the second scan signal to the error circuit.

12. The computer program product of claim 10, further comprising:

wherein the first instantiated cloned latch is further configured to receive a first scan input signal and to generate a first scan output signal;

wherein the first instantiated cloned latch is further configured to propagate the first scan output signal to a scan error collector circuit;

the scan error collector circuit comprising an exclusive OR gate; and wherein the scan error collector circuit couples to the error circuit.

13. The computer program product of claim 9, further comprising:

wherein the first configuration comprises a second master latch; and computer readable program code configured to select between the first master latch and the second master latch to select a master latch for cloning.

14. The computer program product of claim 9, further comprising:

wherein the first configuration comprises a second master latch; and wherein the second configuration further comprises a second abstract latch based on the second master latch.

15. The computer program product of claim 9, further comprising:

wherein the first configuration comprises a second master latch;

wherein the second configuration further comprises a second abstract latch based on the second master latch;

wherein the third configuration comprises a second instantiated clone latch, a fourth fanout path, and a fifth fanout path;

wherein the fourth fanout path comprises a first plurality of output sinks, coupled from the second master latch to the logic cone;

wherein the fifth fanout path comprises a second plurality of output sinks, coupled from the second instantiated clone latch to the logic cone;

wherein output sinks in the second fanout path are not coupled directly to the first instantiated cloned latch and output sinks in the second fanout path are not coupled directly to the first master latch;

wherein the first instantiated cloned latch is further configured to receive a first scan input signal and to generate a first scan output signal;

wherein the first instantiated cloned latch is further configured to propagate the first scan output signal to a first exclusive OR gate of a scan error collector circuit;

wherein the second instantiated cloned latch is further configured to receive a second scan input signal and to generate a second scan output signal;

wherein the second instantiated cloned latch is further configured to propagate the second scan output signal to a second exclusive OR gate of the scan error collector circuit;

the scan error collector circuit comprising the first exclusive OR gate, the second exclusive OR gate, and a first OR gate; and wherein the first OR gate couples to the error circuit.

16. The computer program product of claim 9, further comprising:

the error circuit comprising a data input; and wherein the data input couples to logic zero.

17. A system, comprising:

a hardware user interface configured to receive user input from a user;

a generation module configured to generate a first behavioral model of a circuit, based on received user input, the first behavioral model describing a physical circuit in a first configuration;

wherein the first configuration comprises a first master latch, a first fanout path, and a logic cone;

the first master latch coupled to the first fanout path;

the first master latch configured to receive a first data input signal;

wherein the first fanout path comprises a plurality of output sinks, each of the plurality of output sinks coupled to the logic cone;

a module editor configured to modify the first behavioral model to generate a second behavioral model, the second behavioral model describing the physical circuit in a second configuration;

wherein the second configuration comprises an error circuit and an abstract latch clone;

wherein the abstract latch clone is based on the first master latch; and the module editor further configured to generate a configuration file based on the second behavioral model;

wherein the configuration file comprises information representing a plurality of instantiated latch clones based on the abstract latch clone;

wherein the instantiated latch clones are each configured to couple to the first data input signal and to one or more output sinks of the plurality of output sinks; and wherein the second behavioral model and the configuration file are together configured for input to a synthesis module.

18. The system of claim 17, further comprising:

the synthesis module configured to synthesize a first structural model from the second behavioral model and the configuration file;

wherein the first structural model describes the physical circuit in a third configuration;

wherein the third configuration comprises a first instantiated clone latch, a second fanout path, and a third fanout path;

wherein the second fanout path comprises a first subset of output sinks from the first fanout path, coupled from the first master latch to the logic cone;

wherein the third fanout path comprises a second subset of output sinks from the first fanout path, coupled from the first instantiated clone latch to the logic cone; and wherein output sinks in the second fanout path are not coupled directly to the first instantiated cloned latch and output sinks in the second fanout path are not coupled directly to the first master latch.

19. The system of claim 18, further comprising:

wherein the first master latch is further configured to receive a first scan input signal, and to generate a first data signal and a first scan signal;

wherein the first master latch is further configured to propagate the first data signal and the first scan signal along the second fanout path;

wherein the first instantiated cloned latch is further configured to receive the first scan input signal and to generate a second scan signal; and wherein the first instantiated cloned latch is further configured to propagate the second scan signal to the error circuit.

20. The system of claim 18, further comprising:

wherein the first instantiated cloned latch is further configured to receive a first scan input signal and to generate a first scan output signal;

wherein the first instantiated cloned latch is further configured to propagate the first scan output signal to a scan error collector circuit;

the scan error collector circuit comprising an exclusive OR gate; and wherein the scan error collector circuit couples to the error circuit.

21. The system of claim 17, further comprising:

wherein the first configuration comprises a second master latch; and selecting between the first master latch and the second master latch to select a master latch for cloning.

22. The system of claim 17, further comprising:

wherein the first configuration comprises a second master latch; and wherein the second configuration further comprises a second abstract latch based on the second master latch.

23. The system of claim 17, further comprising:

wherein the first configuration comprises a second master latch;

wherein the second configuration further comprises a second abstract latch based on the second master latch;

wherein the third configuration comprises a second instantiated clone latch, a fourth fanout path, and a fifth fanout path;

wherein the fourth fanout path comprises a first plurality of output sinks, coupled from the second master latch to the logic cone;

wherein the fifth fanout path comprises a second plurality of output sinks, coupled from the second instantiated clone latch to the logic cone;

wherein output sinks in the second fanout path are not coupled directly to the first instantiated cloned latch and output sinks in the second fanout path are not coupled directly to the first master latch;

wherein the first instantiated cloned latch is further configured to receive a first scan input signal and to generate a first scan output signal;

wherein the first instantiated cloned latch is further configured to propagate the first scan output signal to a first exclusive OR gate of a scan error collector circuit;

wherein the second instantiated cloned latch is further configured to receive a second scan input signal and to generate a second scan output signal;

wherein the second instantiated cloned latch is further configured to propagate the second scan output signal to a second exclusive OR gate of the scan error collector circuit;

the scan error collector circuit comprising the first exclusive OR gate, the second exclusive OR gate, and a first OR gate; and wherein the first OR gate couples to the error circuit.

24. The system of claim 17, further comprising:

the error circuit comprising a data input; and wherein the data input couples to logic zero.

\* \* \* \* \*